United States Patent [19]

Kariya

[11] Patent Number: 5,763,329
[45] Date of Patent: Jun. 9, 1998

[54] METHOD FOR MAKING SEMICONDUCTOR DEVICE BY COATING AN SOG FILM IN AMINE GAS ATMOSPHERE

[75] Inventor: Atsushi Kariya, Tokyo, Japan

[73] Assignee: NEC Corporation, Tokyo, Japan

[21] Appl. No.: 806,666

[22] Filed: Feb. 26, 1997

[51] Int. Cl.[6] .................................. H01L 21/316
[52] U.S. Cl. .................. 438/780; 438/781; 438/782; 427/240
[58] Field of Search ...................... 438/782, 780, 438/781, 623, 624; 427/240

[56] References Cited

U.S. PATENT DOCUMENTS

| | | | |
|---|---|---|---|
| 4,103,045 | 7/1978 | Lesaicherre et al. | 438/782 |
| 4,983,546 | 1/1991 | Hyun et al. | 438/782 |
| 5,094,884 | 3/1992 | Hillman et al. | 438/782 |
| 5,106,787 | 4/1992 | Yen | 438/782 |
| 5,393,702 | 2/1995 | Yang et al. | |
| 5,506,177 | 4/1996 | Kishimoto et al. | |

FOREIGN PATENT DOCUMENTS

| | | |
|---|---|---|
| 0 461 782 A2 | 5/1991 | European Pat. Off. |
| 0 611 067 A2 | 8/1994 | European Pat. Off. |
| 6425543 | 1/1989 | Japan |
| 1132128 | 5/1989 | Japan |
| 4150029 | 5/1992 | Japan |
| 4174520 | 6/1992 | Japan |
| 4196537 | 7/1992 | Japan |

OTHER PUBLICATIONS

European Search Report, Sep. 24, 1997.
Wolf, Stanley *Silicon Processing for the VLSI ERA*, vol. 2, pp. 229–235, 1990.

Primary Examiner—Charles L. Bowers, Jr.
Assistant Examiner—M. Whipple
Attorney, Agent, or Firm—Whitham, Curtis & Whitman

[57] ABSTRACT

A method for making a semiconductor device, includes steps of: forming a lower wiring on a semiconductor substrate; forming layer insulation film to cover the lower wiring; coating a surface of the layer insulation film with organic or inorganic SOG to form SOG film; heat-treating the SOG film; etching the SOG film to even a surface of the SOG film; forming an aperture reaching through the SOG film and the layer insulation film to the lower wiring; and filling the aperture with a conductive material to form a through-hole, wherein the coating step with the organic or inorganic SOG is conducted in amine system gas atmosphere.

4 Claims, 5 Drawing Sheets

METHOD FOR MAKING SEMICONDUCTOR DEVICE BY COATING AN SOG FILM IN AMINE GAS ATMOSPHERE

FIELD OF THE INVENTION

This invention relates to a method for making a semiconductor device and an apparatus used in the same method, and more particularly to, a method for making a semiconductor device in which organic or inorganic SOG (spin-on-glass) film is formed to even layer insulation film and an apparatus used in the same method.

BACKGROUND OF THE INVENTION

Along with an increase in the integration density of a semiconductor device, the use of multilayer wiring is on the increase and the surface of a substrate becomes more uneven. Therefore, to prevent an upper wiring formed on layer insulation film from cutting, it is necessary for the layer insulation film to be evened. In general, after a lower aluminum wiring is formed on a semiconductor substrate, plasma oxidation film and the like is formed by plasma CVD to provide layer insulation film. Thereafter, to even the layer insulation film, it is coated with organic or inorganic SOG (spin-on-glass) by using a spin-coating machine, so that, in particular, unevenness on the surface of the layer insulation can be corrected. Then, after the entire surface is etched back to provide an even surface by dry etching, through-holes which connect the lower aluminum wiring with an upper aluminum wiring are formed through the layer insulation film and the SOG film by photoresist technique. When the through-holes are formed, it is important for the layer insulation film and the SOG film to have an evenness. If they do not have a sufficient evenness, it is difficult for the photoresist pattern to be formed just along a mask. Therefore, the through-hole may be imperfectly formed, thereby reducing a yield.

However, the above conventional method, in which the SOG film is formed on the layer insulation film to even the layer insulation film, has some problems. The first problem is that the electric resistivity of the through-hole connecting the upper and lower aluminum wirings may be high. This is because the conductivity of the aluminum wiring may be reduced since the moisture contained in the SOG film is released from the through-hole when the through-hole is heat-treated after forming an aluminum wiring inside the through-hole and then it corrodes aluminum.

The second problem is that there may occur a crack in the silica film such as the SOG film or the adjoining layer insulation film. In the conventional method, to solve the first problem due to the moisture in the SOG film, the heat treatment is conducted to release the moisture, gas etc. For example, the heat treatment includes exposing it to a reactive gas such as oxygen (Japanese patent application laid-open No. 4-196537(1992)), exposing it to plasma composed of a carbon-containing gas and oxygen (Japanese patent application laid-open No. 4-174520(1992)), exposing it to CO2 plasma (Japanese patent application laid-open No. 4-150029 (1992)), radiating ultraviolet to it in a gas atmosphere containing fluorine (Japanese patent application laid-open No. 1-132128(1989)), and exposing it to plasma containing fluorine (Japanese patent application laid-open No. 1-25543 (1989)). However, since the thermal stress that SOG film is thermally contracted about 20% by the heat treatment influences the SOG film itself and the adjoining layer insulation film, thereby causing a crack in these films.

SUMMARY OF THE INVENTION

Accordingly, it is an object of the invention to provide a method for making a semiconductor device in which moisture content in SOG film is significantly reduced such that the conductivity of through-hole can be kept in good condition and the occurrence of crack due to thermal contraction can be suppressed.

It is a further object of the invention to provide an apparatus for making a semiconductor device by which a semiconductor device with a higher reliability can be made.

According to the invention, a method for making a semiconductor device, comprises the step of:

coating a surface of a semiconductor substrate with organic or inorganic SOG to form SOG film;

wherein the coating step with the organic or inorganic SOG is conducted in amine system gas atmosphere.

According to another aspect of the invention, a method for making a semiconductor device, comprises the steps of:

forming a lower wiring on a semiconductor substrate;

forming layer insulation film to cover the lower wiring;

coating a surface of the layer insulation film with organic or inorganic SOG to form SOG film;

heat-treating the SOG film;

etching the SOG film to even a surface of the SOG film;

forming an aperture reaching through the SOG film and the layer insulation film to the lower wiring; and filling the aperture with a conductive material to form a through-hole;

wherein the coating step with the organic or inorganic SOG conducted in amine system gas atmosphere.

According to further aspect of the invention, an apparatus for making a semiconductor device which is used for forming SOG film on a surface of a semiconductor substrate, comprises;

a chamber the inside of which is able to be kept airtight;

a turntable which is disposed in the chamber and is rotatable while putting the semiconductor substrate on the turntable;

means for dropping SOG on the surface of the semiconductor substrate; and means for providing amine system gas atmosphere with the inside of the chamber.

BRIEF DESCRIPTION OF THE DRAWINGS

The invention will be explained in more detail in conjunction with the appended drawings, wherein.

DESCRIPTION OF THE PREFERRED EMBODIMENTS

A method for making a semiconductor device and an apparatus used in the same method in the first preferred embodiment will be explained in FIGS. 1 and 2.

Figure 1:
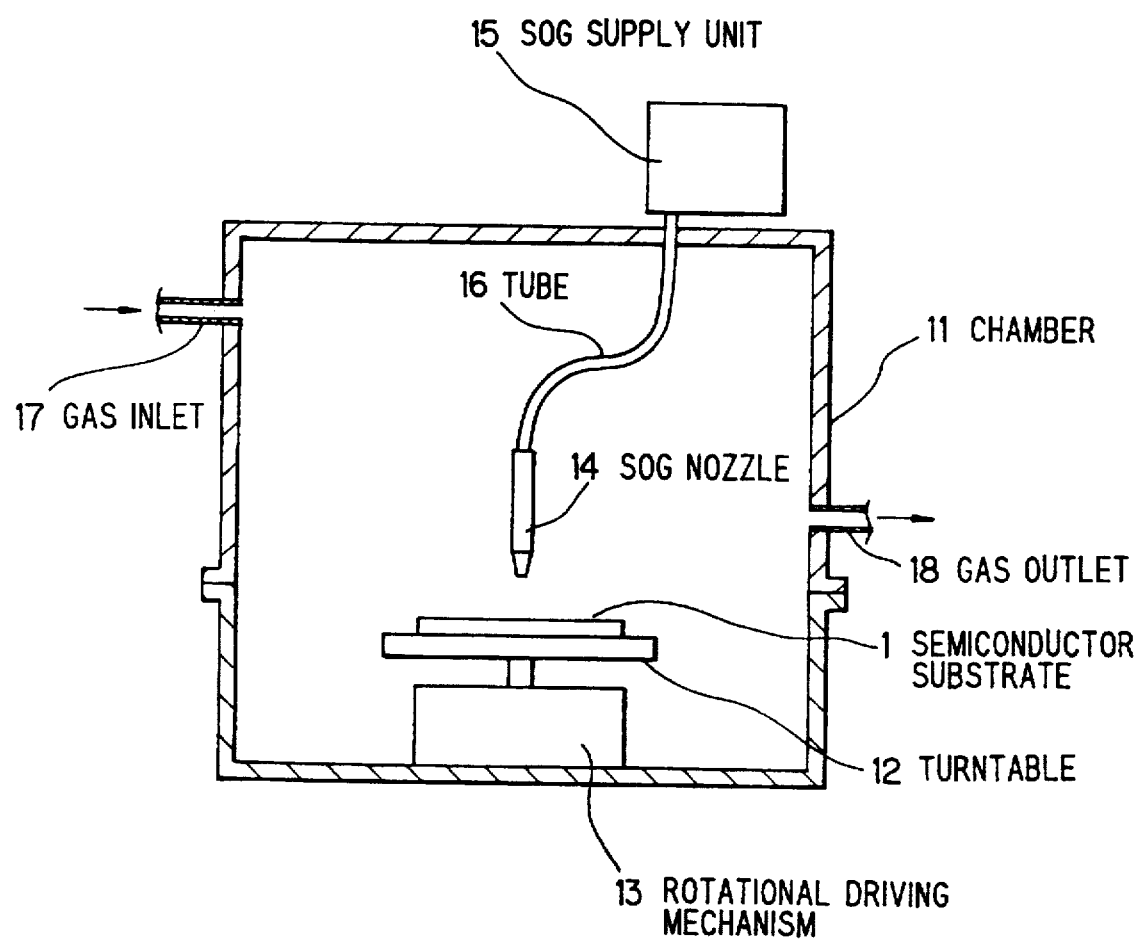
FIG. 1 is a cross sectional view showing a SOG coating apparatus in a first preferred embodiment according to the invention.

FIG. 1 shows a schematic composition of a SOG coating apparatus, i.e., a spin-coating machine, which is used in the method in the first embodiment. In a chamber 11 the inside of which can be kept airtight, disposed is a turntable 12 which can be horizontally rotated by a rotational driving mechanism 13. On the turntable 12, a semiconductor substrate 1 is disposed and it is fixed on the turntable 12 by a vacuum attraction means etc. Above the turntable 12, disposed is a nozzle 14 from which organic or inorganic SOG supplied through a tube 16 from a SOG supply unit 15 drops. The chamber 11 has a gas inlet 17 and a gas outlet 18 through which desired gas atmosphere can be prepared. In the first embodiment, the inside atmosphere of the chamber 11 can be of an amine system gas such as monoethanolamine.

Figure 2A:
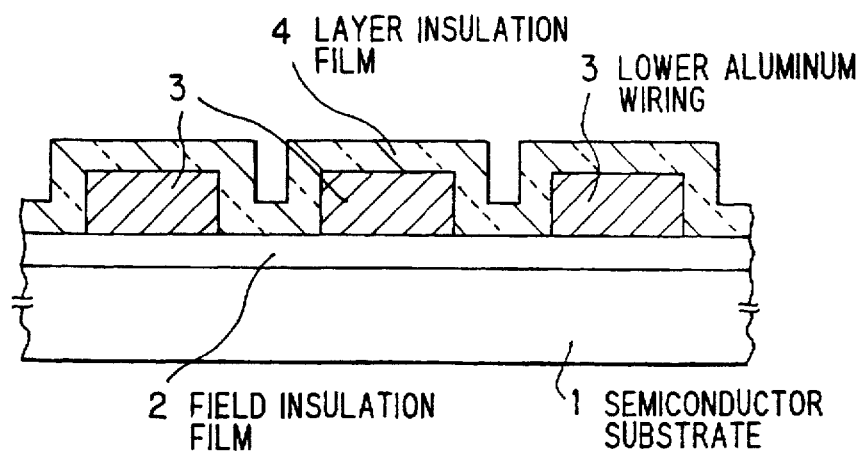
FIGS. 2A to 2D are cross sectional views showing a semiconductor device fabricated by using a method in a first preferred embodiment according to the invention.
Figure 2B:
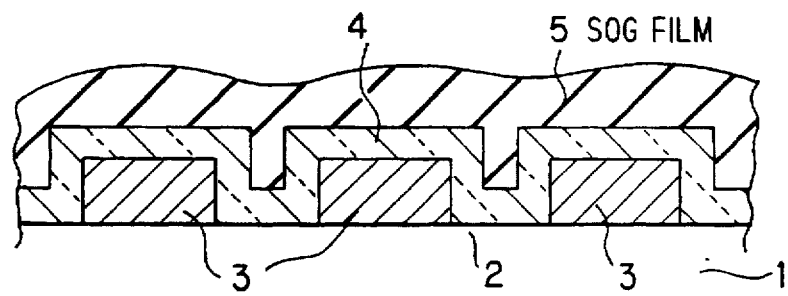

The process of evening layer insulation film by using the above coating apparatus will be explained below. FIGS. 2A to 2D are cross sectional views showing the process. First, as shown in FIG. 2A, a lower aluminum wiring 3 with a desired pattern is formed on field insulation film 2 on the semiconductor substrate 1 in the form of a wafer, then forming plasma silicon oxidation film thereon by plasma CVD to provide the layer insulation film 4. Then, fixing the semiconductor substrate 1 on the turntable 12, supplying the inside of the chamber 11 with the amine system gas from gas inlet 17 to provide the amine system gas atmosphere, then dropping organic or inorganic SOG from the nozzle 14 as well as rotating the turntable 12 at a high speed to coat the surface of the semiconductor substrate 1 with SOG, thereby SOG film 5 is formed as shown in FIG. 2B. The thickness of the SOG film 5 formed is set to be, e.g., 0.1 to 0.6 μm.

Figure 3:
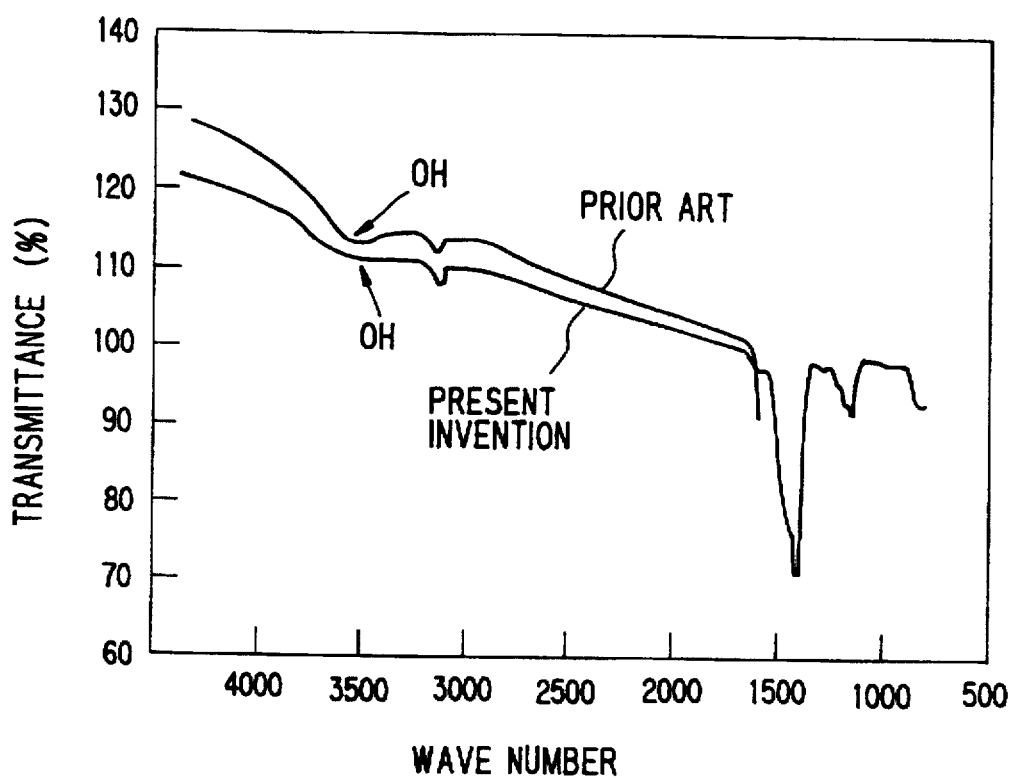
FIG. 3 shows moisture contents in SOG films prepared by the conventional method and the method in the first embodiment.

As described above, by coating with SOG in the amine system gas atmosphere, the polymerization reaction in SOG is promoted, thereby fine film with a lower moisture content can be formed. FIG. 3 shows a comparison as to moisture content between SOG film to be formed in the air according to the prior art and SOG film to be formed in the amine system gas atmosphere according to the invention. From the data of OH group in FIG. 3, it is proved that the moisture content of SOG film according to the invention is decreased.

Figure 2C:
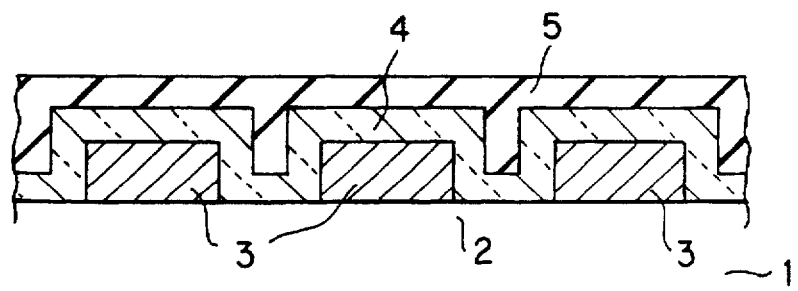
Figure 4:
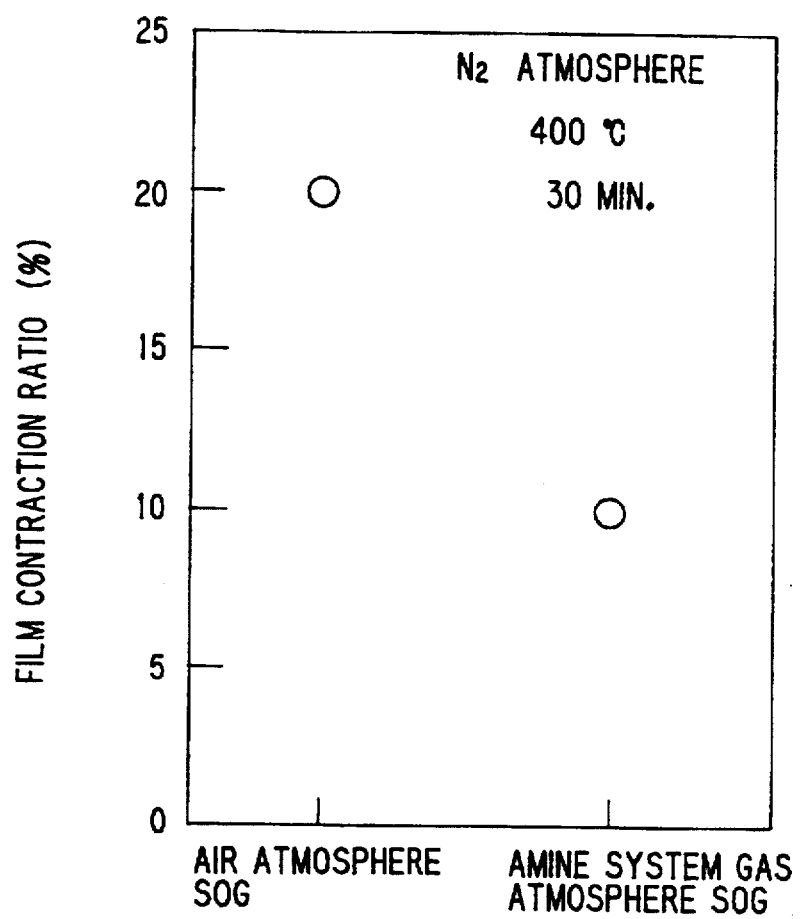
FIG. 4 shows the film contraction ratios of SOG films prepared by the conventional method and the method in the first embodiment.

Next, to remove the gas contained in the SOG film 5, the semiconductor substrate 1 is transferred into a bake oven (not shown), and then the semiconductor substrate 1 with the SOG film 5 is baked at a temperature of 300° to 400° C. for 30 to 60 min. in nitrogen atmosphere. Here, since the SOG film in the air atmosphere according to the prior art, as shown in FIG. 4, has a film contraction ration of around 20%, there may be occurred a crack in the SOG film itself. In the first embodiment, since the moisture content of the SOG film is decreased, the film contraction ratio is, as shown in FIG. 4, reduced to around 10%, therefore the occurrence of the crack can be significantly suppressed. Thereafter, the SOG film 5 is, as shown in FIG. 2C, etched back to provide an even surface.

Figure 2D:
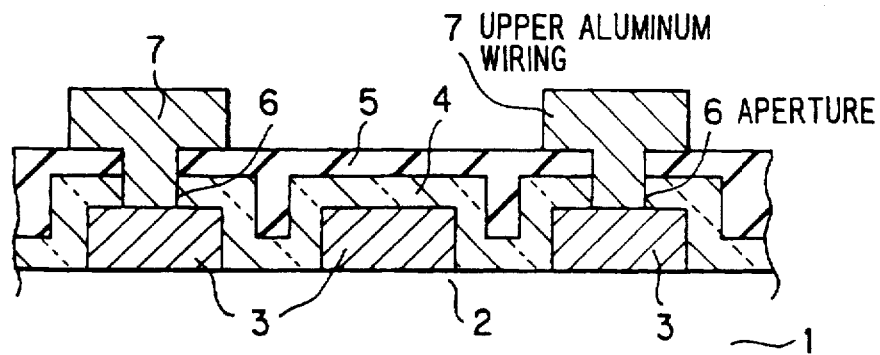

Then, as shown in FIG. 2D, forming apertures 6 reaching to the lower aluminum wiring 3 through the SOG film 5 and the layer insulation film 4, filling the inside of the aperture 6 with a conductive material or forming an upper aluminum wiring 7 over a region including the apertures 6, thereby the apertures 6 are formed as through-holes to electrically interconnect the upper and lower aluminum wirings 3, 7. Also in this state, little moisture is released from the SOG film 5 to the through-hole 6 even when a heat treatment is thereafter conducted, therefore aluminum can be prevented from corroding and the conductivity of the aluminum wiring 7 can be kept in good condition.

Figure 5:
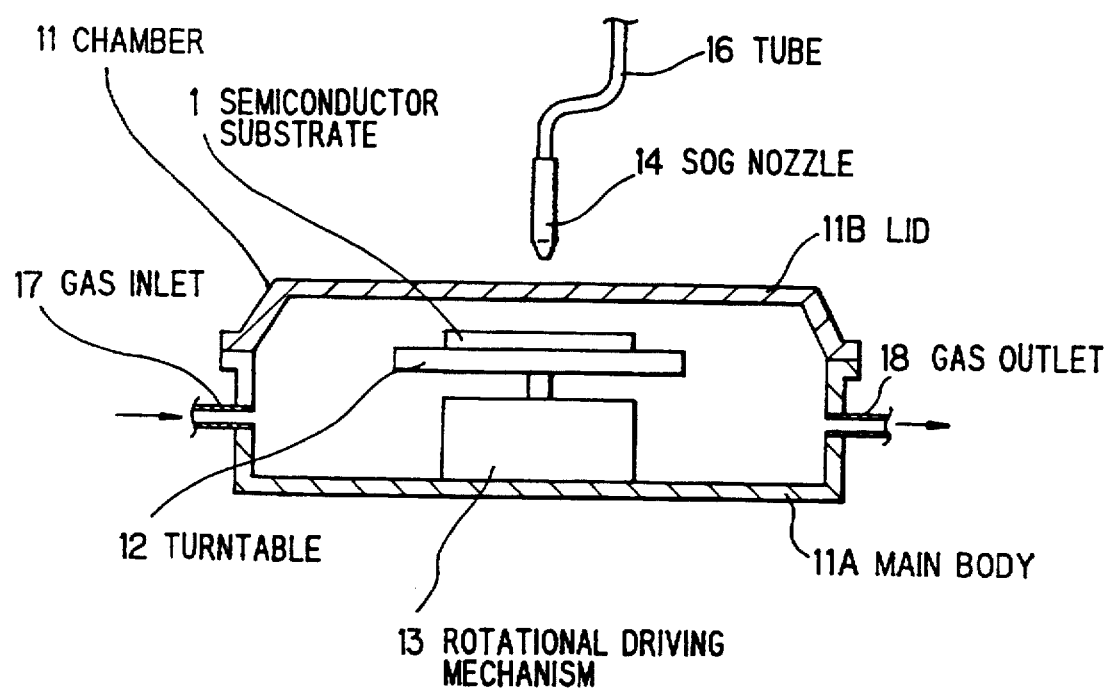
FIG. 5 is a cross sectional view showing a SOG coating apparatus in a second preferred embodiment according to the invention.

An apparatus in the second preferred embodiment will be explained in FIG. 5, wherein like parts are indicated by like reference numerals as used in FIG. 1.

In the second embodiment, only the turntable 12 is packaged in the chamber 11. Namely, the chamber 11 is composed of a main body 11A on which the rotational driving mechanism 13 and the turntable 12 are disposed and a lid 11B removable from on the main body 11A, where the gas inlet 17 and gas outlet 18 are connected to the main body 11A. The nozzle 14 for supplying SOG is disposed above the lid 11B. When this apparatus is used, the semiconductor substrate 1 is first fixed on the turntable 12 in the state that the lid 11B is removed. Then, after dropping SOG on the surface of the semiconductor substrate 1 from the nozzle 14, the lid 11B is shut up. After preparing the amine system gas atmosphere by supplying the inside of the chamber 11 with an amine system gas from the gas inlet 17, the turntable 12 is then rotated to form SOG film.

Also in the second embodiment, by coating with SOG in the amine system gas atmosphere, the polymerization reaction in SOG is promoted. As a result, fine film with a lower moisture content can be formed and the occurrence of the crack can be suppressed since the film contraction ratio is decreased.

Meanwhile, in the first and second embodiments, various amine system gases can be used. Furthermore, by properly controlling the gas concentration depending on the kind of SOG and the thickness of SOG film to be formed, SOG film with less moisture and of few occurrence of crack can be formed.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for making a semiconductor device, comprising the step of:

coating a surface of a semiconductor substrate with organic or inorganic SOG to form SOG film, wherein said coating step with said organic or inorganic SOG is conducted in amine system gas atmosphere.

2. A method for making a semiconductor device, according to claim 1, further comprising the step of:

heat-treating said SOG film in nitrogen gas atmosphere after said coating step with said organic or inorganic SOG.

3. A method for making a semiconductor device, comprising the steps of:

forming a lower wiring on a semiconductor substrate;

forming layer insulation film to cover said lower wiring;

coating a surface of said layer insulation film with organic or inorganic SOG to form SOG film;

heat-treating said SOG film;

etching said SOG film to even a surface of said SOG film;

forming an aperture reaching through said SOG film and said layer insulation film to said lower wiring; and filling said aperture with a conductive material to form a through-hole, wherein said coating step with said organic or inorganic SOG is conducted in amine system gas atmosphere.

4. A method for making a semiconductor device, according to claim 3, wherein:

said heat-treating step of said SOG film is conducted in nitrogen gas atmosphere.

* * * * *